United States Patent
Cheng

(10) Patent No.: US 7,427,883 B1
(45) Date of Patent: Sep. 23, 2008

(54) HIGH BANDWIDTH PHASE LOCKED POOL (PLL)

(75) Inventor: Chi Fung Cheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/542,961

(22) Filed: Oct. 3, 2006

Related U.S. Application Data

(62) Division of application No. 10/802,597, filed on Mar. 16, 2004, now Pat. No. 7,116,144.

(51) Int. Cl.
*H03L 7/16* (2006.01)

(52) U.S. Cl. .................... 327/156; 327/160; 327/115; 327/116

(58) Field of Classification Search ............... None
See application file for complete search history.

(56) References Cited

U.S. PATENT DOCUMENTS

| | | | | |
|---|---|---|---|---|
| 6,114,882 A | * | 9/2000 | Flynn | 327/103 |
| 6,114,914 A | * | 9/2000 | Mar | 331/16 |
| 6,525,615 B1 | * | 2/2003 | Masenas et al. | 331/34 |
| 6,542,013 B1 | * | 4/2003 | Volk et al. | 327/115 |

* cited by examiner

*Primary Examiner*—N. Drew Richards
*Assistant Examiner*—An T. Luu

(57) ABSTRACT

A phase locked loop (PLL) is provided. In one implementation, the PLL includes a feedback loop having a frequency multiplier and an integer divider to generate a divided signal. The PLL includes a re-sampling circuit operable to re-sample one or more digital pulses of the divided signal using one or more phase signals if a multiplication factor of the frequency multiplier does not divide evenly into the integer divisor.

40 Claims, 8 Drawing Sheets

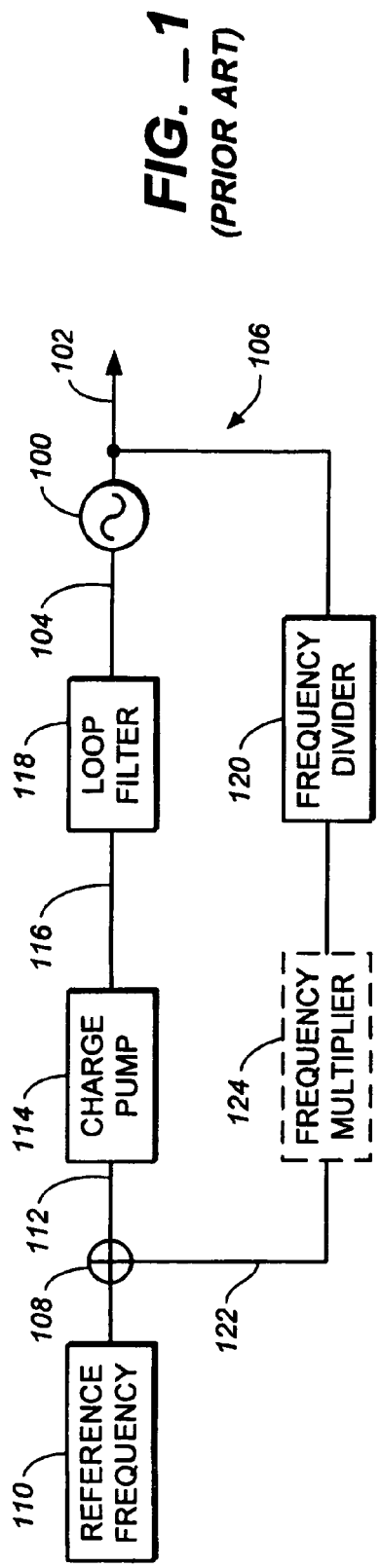
FIG._1 (PRIOR ART)
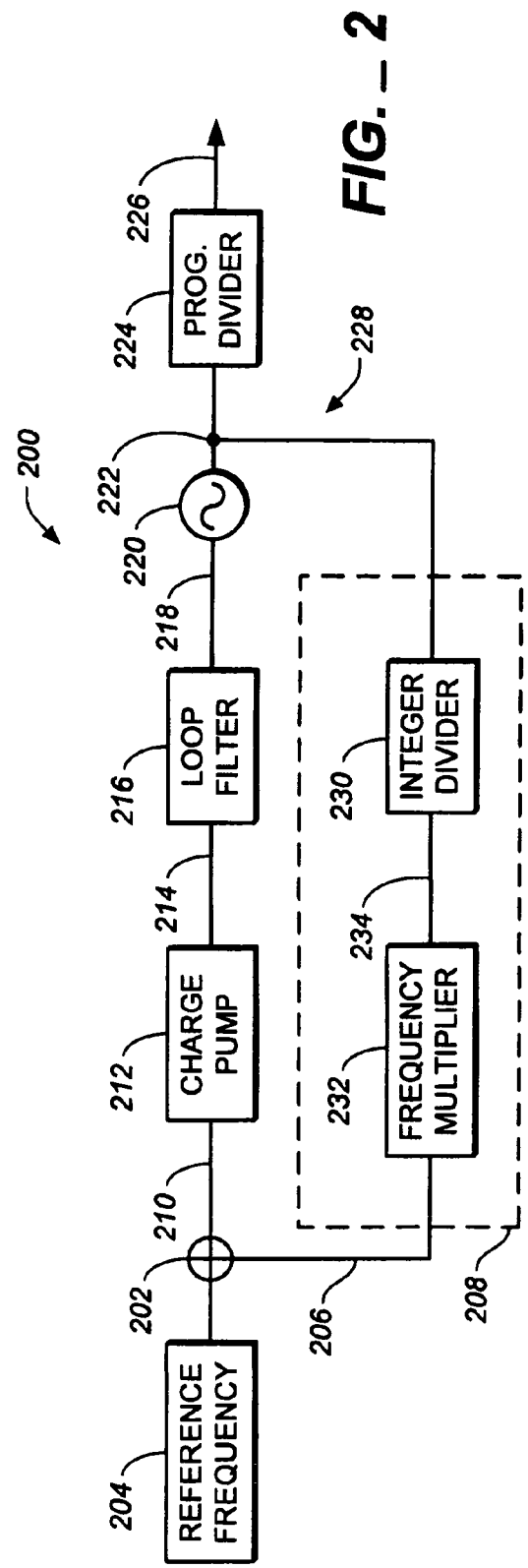
FIG._2

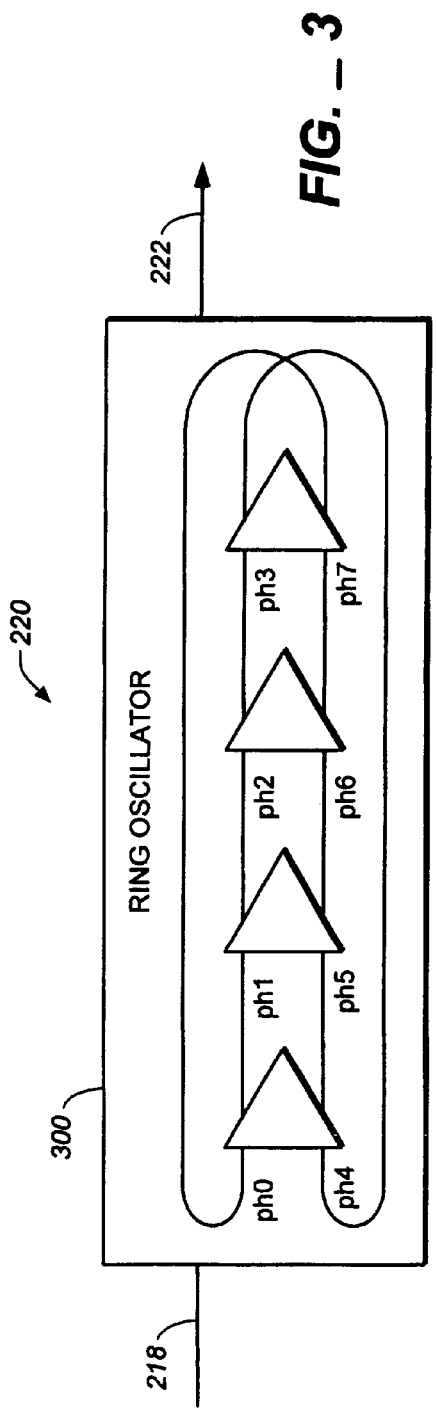
FIG._3
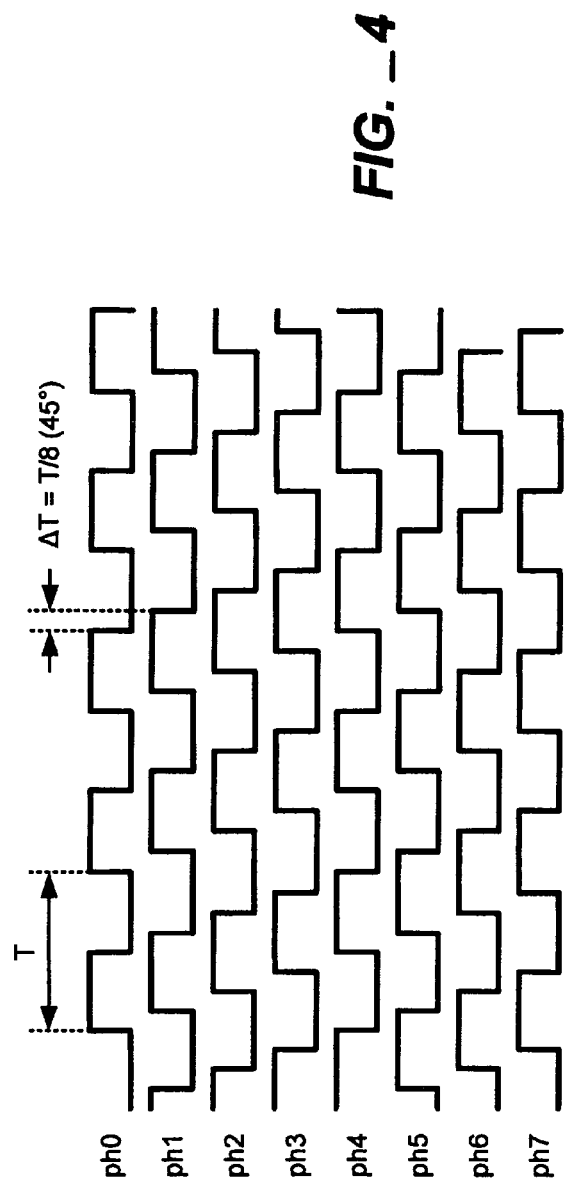
FIG._4

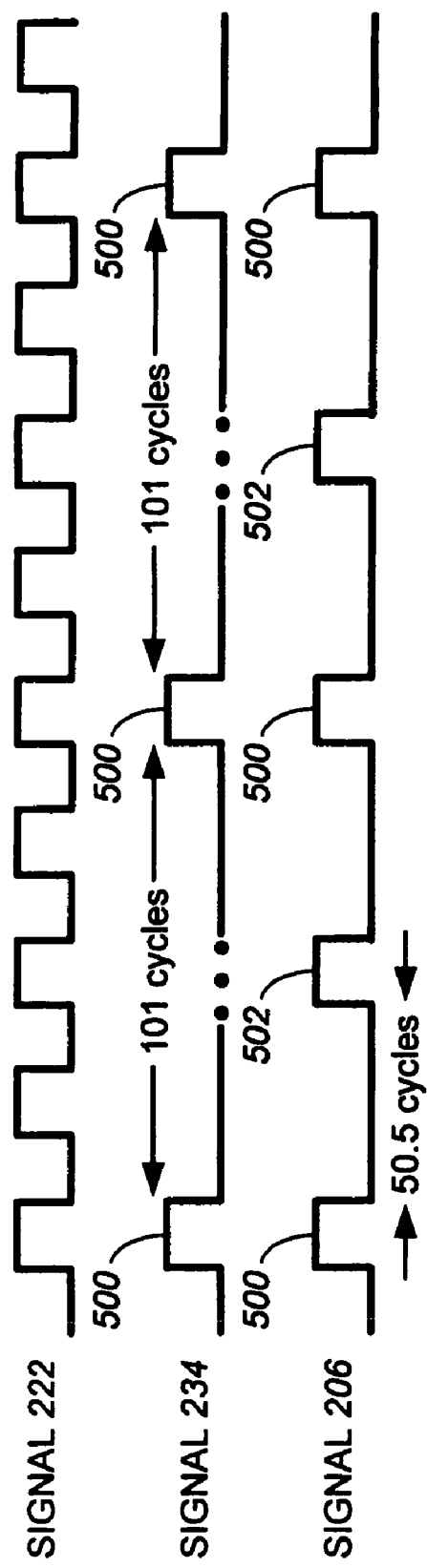

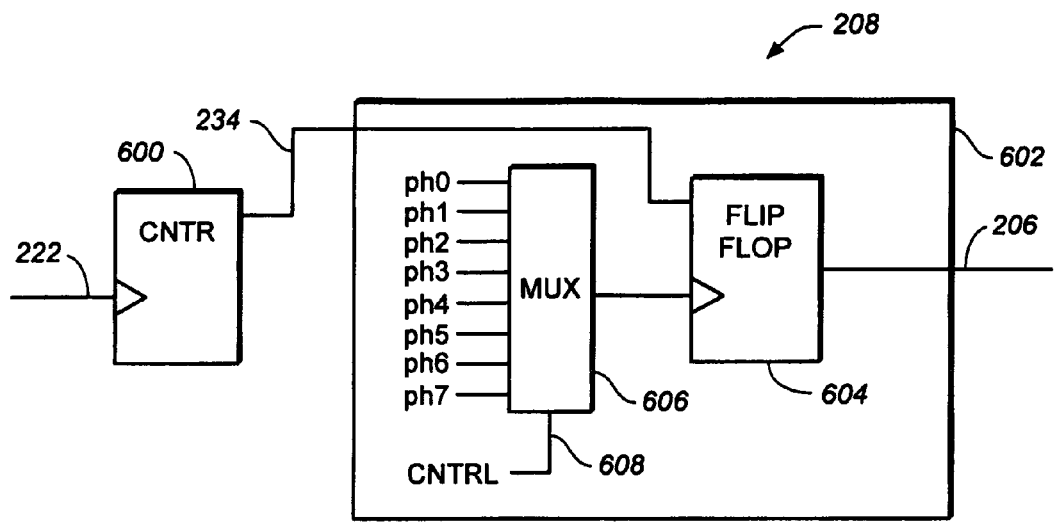
FIG. _ 6
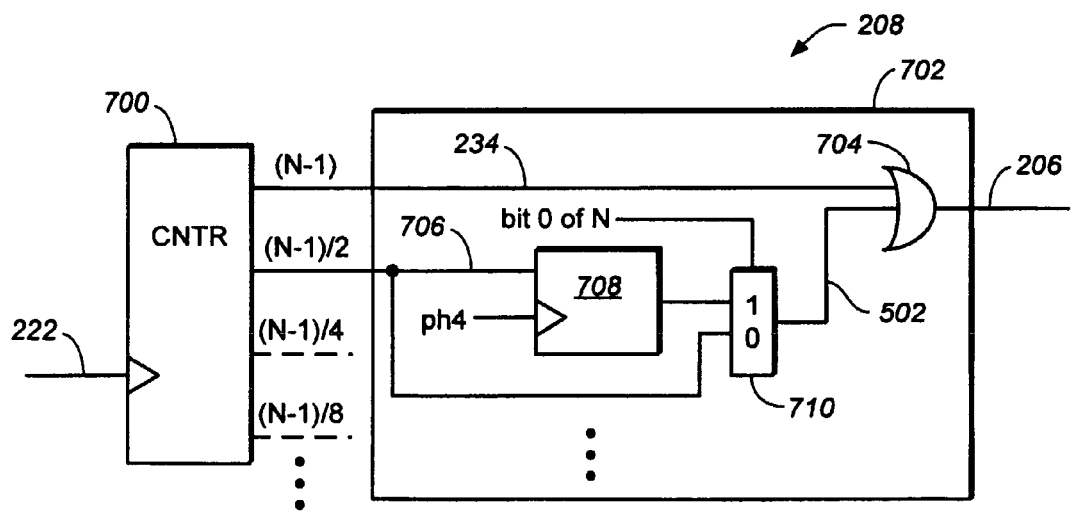
FIG. _ 7

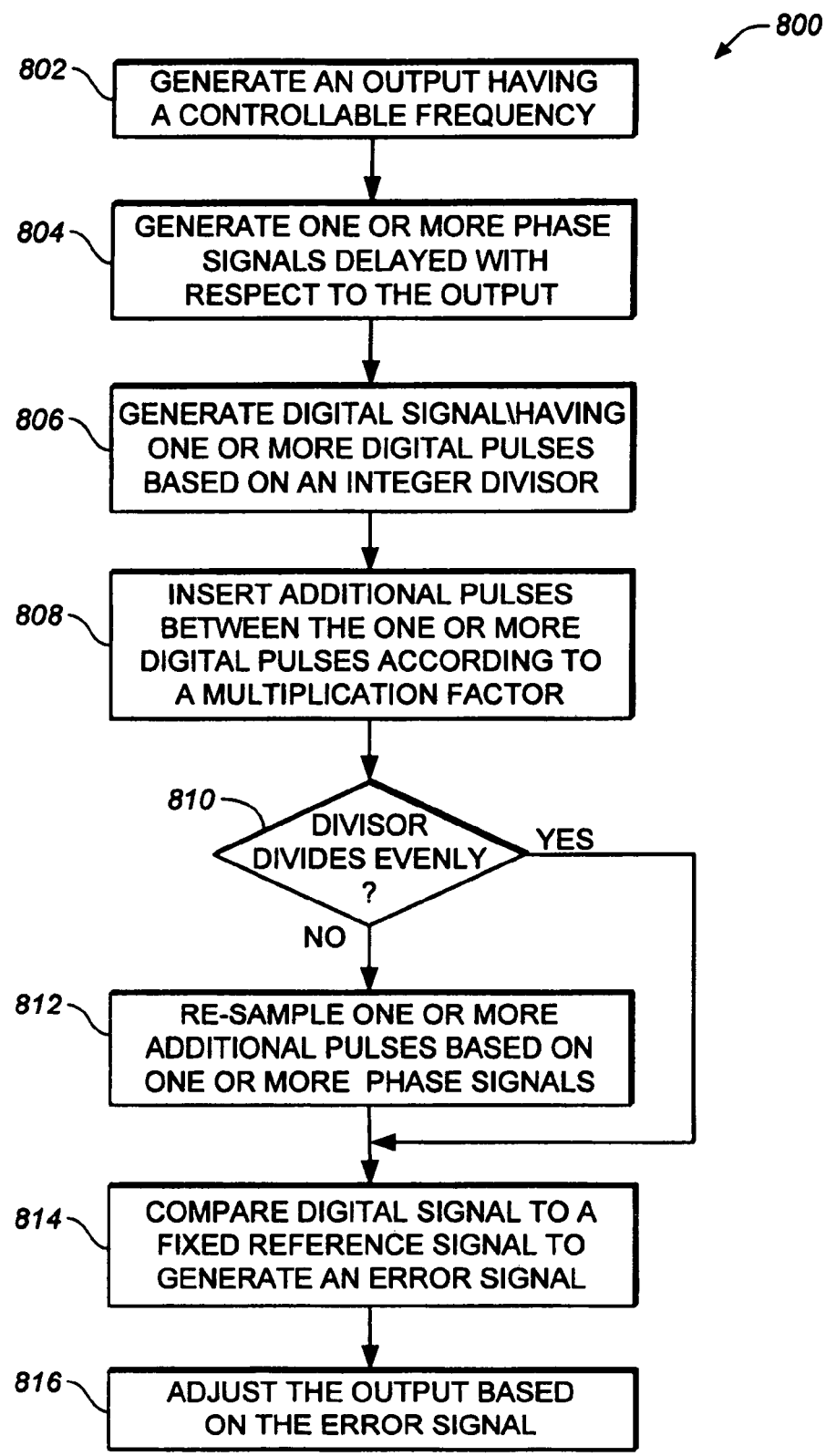
FIG. _8

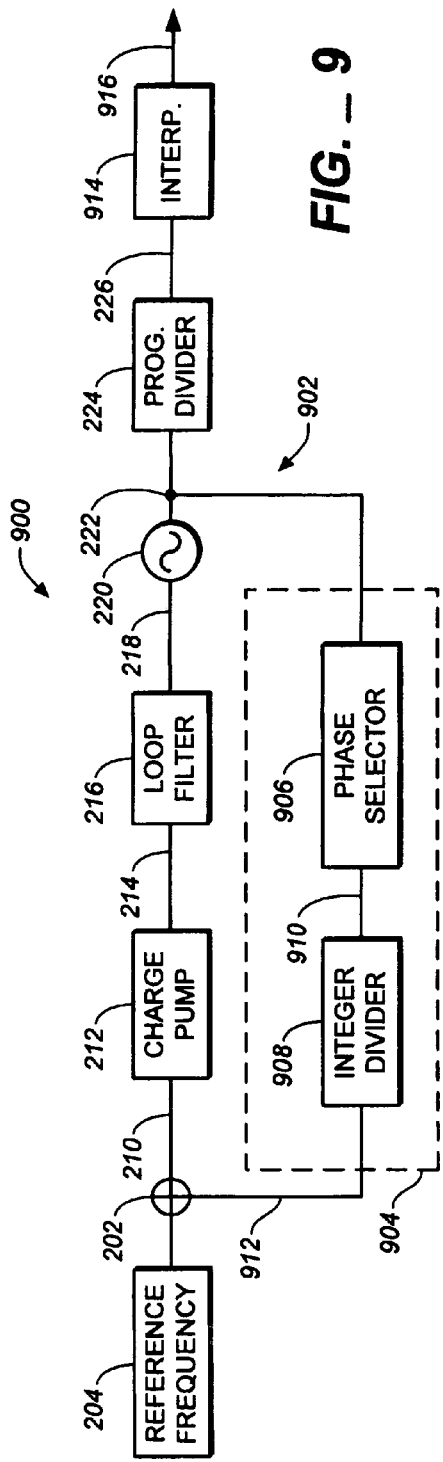
FIG. _ 9
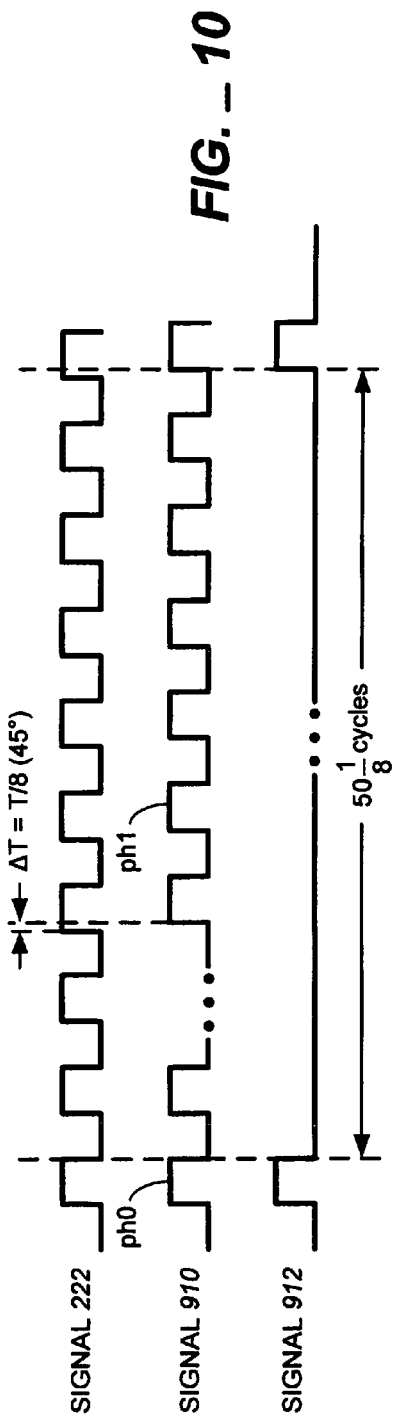
FIG. _ 10

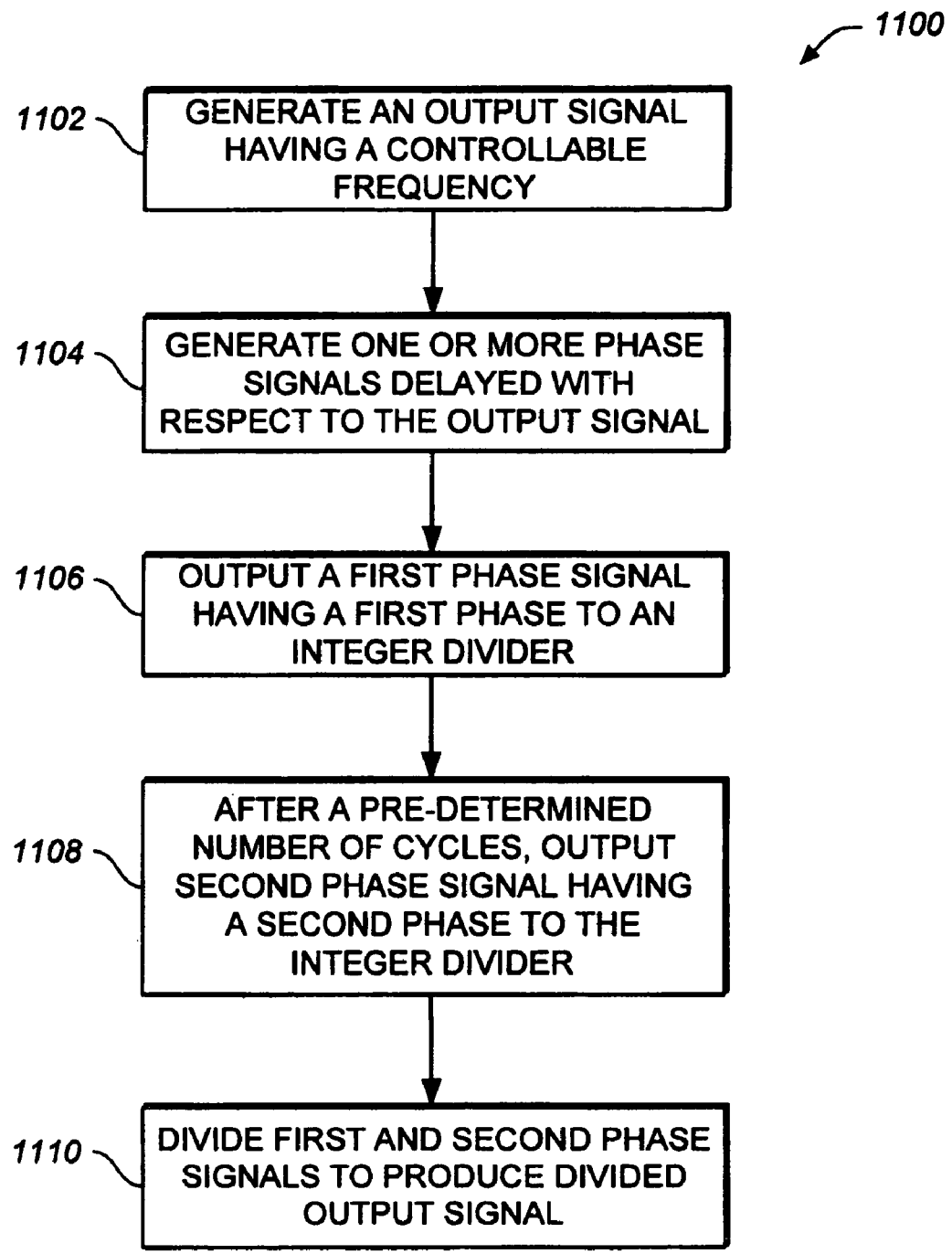
FIG. _ 11

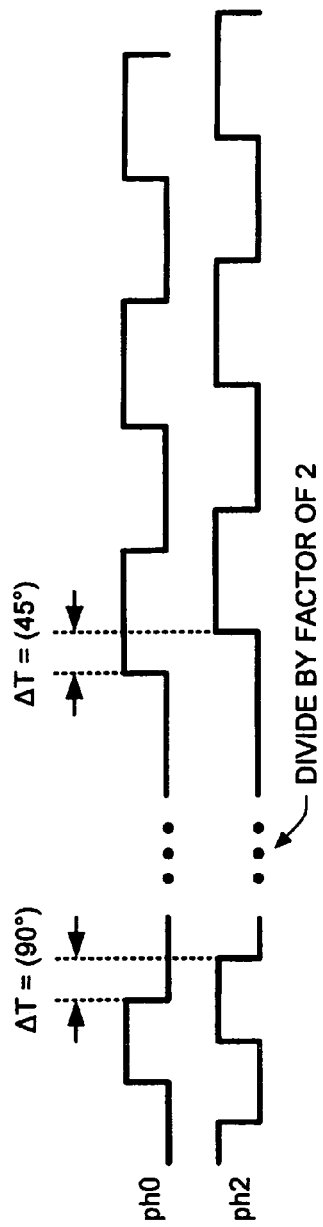
FIG._12
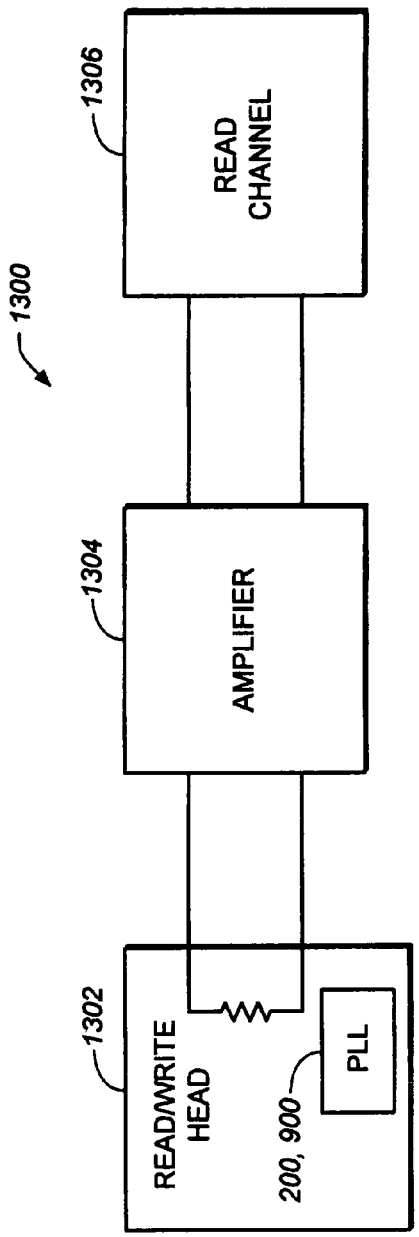
FIG._13

HIGH BANDWIDTH PHASE LOCKED POOL (PLL)

CROSS-REFERENCE

This application is a divisional application (and claims the benefit of priority under 35 USC 120) of U.S. application Ser. No. 10/802,597, filed Mar. 16, 2004, now U.S. Pat. No. 7,116, 144. The disclosure of this application is considered part of (and is incorporated by reference in) the disclosure of this application.

BACKGROUND

This disclosure relates to electrical circuits and signal processing.

Disk drive systems traditionally employ a phase locked loop (PLL) for retrieval of data from a data signal encoded onto a magnetic medium (e.g., a floppy diskette). The PLL allows a signal frequency to be precisely controlled and, accordingly, permits the data encoded onto a magnetic medium to be reliably decoded at a stable, known frequency.

A conventional PLL frequency synthesizer is shown in FIG. 1 and includes a voltage controlled oscillator (VCO) 100 that produces a VCO output signal 102 at a desired frequency based on a VCO frequency control signal 104. VCO frequency control signal 104 is generated by a feedback loop 106. VCO output signal 102 is coupled through feedback loop 106 to a phase frequency detector 108 which compares the phase (or frequency) of VCO output signal 102 (or multiple thereof as described below) to that of a fixed frequency reference signal 110. Phase frequency detector 108 generates an error signal 112 corresponding to a phase (or frequency) difference between VCO output signal 102 and fixed frequency reference signal 110. A charge pump 114 converts error signal 112 from phase frequency detector 108 into a charge pump output signal 116. Charge pump output signal 116 is smoothed by a low pass loop filter 118 to generate VCO control signal 104. VCO control signal 104 is then applied to VCO 100 such that the phase (or frequency) of VCO output signal 102 matches that of fixed frequency reference signal 110.

Typically, a frequency divider 120 is included in PLL feedback loop 106 to divide the frequency of VCO output signal 102 to a frequency that is a multiple of that of fixed frequency reference signal 110. Frequency divider 120 generates a divided frequency output signal 122 that is compared by phase frequency detector 108 to fixed frequency reference signal 110. The frequency of a signal produced by VCO 100 is constantly controlled such that it is phase locked to a multiple of that of fixed frequency reference signal 110. For example, if frequency divider 120 divides by integers only, the smallest increment (i.e., step size) in the frequency of VCO output signal 102 is equal to the frequency of fixed frequency reference signal 110.

To increase the VCO output frequency resolution, frequency divider 120 is typically implemented as a fractional divider. A fractional divider fractionally divides an input signal. However, a conventional PLL including a fractional divider may introduce undesirable phase jitter or phase noise in VCO output signal 102.

A frequency multiplier 124 can also be included within feedback loop 106 to increase the VCO output frequency resolution. Frequency multiplier 124 is typically implemented using a second PLL that may introduce additional phase jitter or phase noise.

SUMMARY

In general, in one aspect, a PLL is provided having a feedback loop that includes: an integer divider operable to divide a feedback loop signal in accordance with an integer divisor and produce a divided signal; a frequency multiplier operable to multiply the divided signal by a multiplication factor, including inserting one or more additional digital pulses into the divided signal to generate a multiplied signal; and a re-sampling circuit operable to re-sample one or more of the additional digital pulses inserted into the divided signal if the multiplication factor does not divide evenly into the integer divisor.

Particular implementations can include one or more of the following features. The re-sampling circuit can be operable to re-sample one or more of the additional digital pulses inserted into the divided signal using one or more phase signals, in which each of the phase signals are delayed with respect to each other. The PLL can further include a multiphase voltage controlled oscillator operable to generate the one or more phase signals. The re-sampling circuit can include a flip flop that is clocked using one or more of the phase signals to re-sample one or more of the additional digital pulses. The re-sampling circuit can also include a multiplexer that is operable to select a given phase signal to clock the flip flop. The re-sampling circuit can include a multiplexer that is operable to be controlled by a least significant bit of a binary value of the integer divisor for re-sampling one or more of the additional digital pulses. The re-sampling circuit can further include an OR gate operable to insert one or more of the additional digital pulses into the divided signal.

In general, in another aspect, a PLL is provided having a feedback loop that includes a phase selector operable to initially provide a first feedback loop signal having a first phase to an integer divider for a predetermined number of cycles. The phase selector is further operable to provide a second feedback loop signal having a second phase to the integer divider after the predetermined number of cycles. The integer divider is operable to divide each of the first feedback loop signal and the second feedback loop signal in accordance with an integer divisor to produce a divided signal.

Particular implementations can include one or more of the following features. The PLL can further include any of the following: a multiphase voltage controlled oscillator operable to generate the first feedback loop signal and the second feedback loop signal; a phase-frequency detector operable to compare a reference signal to the divided signal, and generate an error signal corresponding to a frequency difference between the reference signal and the divided signal; a charge pump operable to convert the error signal into a charge pump output signal; and a loop filter operable to smooth the charge pump output signal and generate a voltage controlled oscillator control signal to control a frequency of an output signal of the voltage controlled oscillator. The PLL can further include an interpolator to interpolate an output of the programmable divider with a signal having a different phase relative to a phase of the output of the programmable divider. The signal having the different phase is derived from the voltage controlled oscillator.

In general, in another aspect, a disk drive system is provided including a read/write head configured to sense changes in magnetic flux on a surface of a disk according to a control signal supplied by a phase locked loop (PLL) and generate a corresponding analog signal; a preamplifier configured to amplify the analog signal; and a read channel configured to receive the amplified analog signal and generate a digital read signal based on the amplified analog signal. The PLL includes an integer divider operable to divide a feedback loop signal in accordance with an integer divisor and produce a divided signal; a frequency multiplier operable to multiply the divided signal by a multiplication factor, including inserting one or more additional digital pulses into the divided signal to generate a multiplied signal; and a re-sampling circuit operable to re-sample one or more of the additional digital pulses inserted into the divided signal if the multiplication factor does not divide evenly into the integer divisor.

In general, in another aspect, a disk drive system is provided including a read/write head configured to sense changes in magnetic flux on a surface of a disk according to a control signal supplied by a phase locked loop (PLL) and generate a corresponding analog signal; a preamplifier configured to amplify the analog signal; and a read channel configured to receive the amplified analog signal and generate a digital read signal based on the amplified analog signal. The PLL includes a phase selector operable to initially provide a first feedback loop signal having a first phase to an integer divider for a predetermined number of cycles. The phase selector is further operable to provide a second feedback loop signal having a second phase to the integer divider after the predetermined number of cycles. The integer divider is operable to divide the first feedback loop signal and the second feedback loop signal in accordance with an integer divisor to produce a divided signal.

These general and specific aspects may be implemented using an apparatus, a system, a method, or any combination of apparatus, systems, and methods.

Implementations can include one or more of the following advantages. A PLL is provided that advantageously has a high loop bandwidth, a high frequency resolution, and reduced phase jitter or phase noise. When the loop bandwidth of the PLL is increased, a faster loop response results, and noise performance may be improved. In one implementation, a frequency multiplier is used in combination with an integer divider to increase the frequency resolution of the PLL. Unlike a conventional PLL, a PLL is provided that does not require a fractional divider or an additional PLL as a frequency multiplier to achieve high frequency resolution. In another implementation, an integer divider is used in series with an interpolator within a PLL feedback loop to implement a fractional divider. Such a fractional divider also can achieve a high frequency resolution for a PLL—e.g., the resolution can be as fine as a difference between adjacent stages of a ring oscillator.

The details of one or more implementations are set forth in the accompanying drawings and the description below. Other features and advantages will be apparent from the description and drawings, and from the claims.

DESCRIPTION OF DRAWINGS

FIG. 1 is a block diagram illustrating a conventional PLL.

FIG. 2 is block diagram of a PLL including a frequency multiplier.

FIG. 3 schematic diagram of a VCO of FIG. 2.

FIG. 4 is a timing diagram illustrating the phase signals of the VCO of FIG. 3.

FIG. 5 shows a timing diagram of an output signal of the VCO of FIG. 3.

FIG. 6 is a block diagram of one implementation of the integer divider and the frequency multiplier of FIG. 2.

FIG. 7 is a block diagram of an alternative implementation of the integer divider and the frequency multiplier of FIG. 2.

FIG. 8 is a flowchart of a process for generating a divided output signal.

FIG. 9 is block diagram of a PLL including an interpolator.

FIG. 10 shows a timing diagram of an output signal of the VCO of FIG. 9.

FIG. 11 is a flowchart of a process for generating a divided output signal.

FIG. 12 shows a timing diagram of output signals of the VCO of FIG. 9.

FIG. 13 is a schematic block diagram of a hard disk drive system.

Like reference symbols in the various drawings indicate like elements.

DETAILED DESCRIPTION

FIG. 2 shows a PLL 200 for generating a signal having a controlled frequency. A phase frequency detector 202 compares a fixed frequency reference signal 204 to a divided frequency signal 206 provided by a high resolution frequency divider 208. Generation of divided frequency signal 206 is described in greater detail below. Phase detector 202 generates an error signal 210 corresponding to the phase difference (or frequency difference) between fixed frequency reference signal 204 and divided frequency signal 206. Phase frequency detector 202 can be any type of analog, digital, or mixed signal device that compares one signal to another and generates an error signal 210 based on the comparison. In one implementation, error signal 210 comprises an up signal and a down signal in which the pulse widths of the up and down signals indicate the magnitude of the phase (or frequency) error. Error signal 210 can be of other forms—for example, analog signals, tri-level signals, and digital signals having other signal formats.

A charge pump 212 converts error signal 210 from phase detector 202 into a charge pump output signal 214. Charge pump 212 can be any type of charge pump including analog, digital, and mixed signal.

Charge pump output signal 214 generated by charge pump 212 is smoothed by a low pass loop filter 216 to generate a VCO control signal 218. VCO control signal 218 is applied to a multiphase VCO 220 that generates a VCO output signal 222. Multiphase VCO 220 can have an operating range between 3000 MHz-1500 MHz. In one implementation, the frequency of VCO output signal 222 is controlled to accurately correspond to a multiple of fixed frequency reference signal 204. VCO output signal 222 can be directed to programmable divider 224. Programmable divider 224 can divide VCO output signal 222 to provide an output signal 226 having a desired resolution. For example, if VCO output signal is a 5 MHz signal, programmable divider 224 can divide the 5 MHz signal by 4 to create an output signal at 1.25 MHz.

FIG. 3 is a diagram illustrating an implementation of multiphase VCO 220 shown in FIG. 2. A differential, 4-stage ring oscillator 300 generates VCO output signal 222 in proportion to VCO control signal 218 received from loop filter 216 (FIG. 2). In addition, ring oscillator 300 generates phase signals (e.g., ph0 ph7) delayed by a predetermined time period (or phase) with respect to VCO output signal 222. The phase signals (e.g., ph0 ph7) can be used to control clocking of one or more flip flops to re-sample a digital pulse as described in greater detail below. FIG. 4 shows a timing diagram, for one implementation, of the phase signals (e.g., ph0-ph7). As shown in FIG. 4, each phase signal phi [i=0, 1, ..., 7] has a delay time of $\Delta T*(i+1)$ [i=0, 1, ..., 0] with respect to ph0. In the example of FIG. 4, in which a cycle of ph0 is T, the delay time $\Delta T$ is approximately equal to T/8 (e.g., 45°).

Generation of divided frequency signal 206 (FIG. 2) will now be described in greater detail. Referring again to FIG. 2, PLL 200 includes a feedback loop 228 that further includes high resolution frequency divider 208. High resolution frequency divider 208 includes an integer divider 230 and a frequency multiplier 232. Integer divider 230 receives and divides VCO output signal 222 by an even or odd integer divisor to produce a divided signal 234. Frequency multiplier 232 multiplies divided signal 234 by inserting one or more digital pulses at determined locations within divided signal 234 to produce an output signal (i.e., divided frequency signal 206), as described in greater detail below. For example, FIG. 5 shows an example timing diagram for VCO output signal 222, divided signal 234, and divided frequency signal 206. In the example of FIG. 5, integer divider 230 divides by an integer divisor of 101 and frequency multiplier 232 is a (2×) multiplier—i.e., multiplies by a factor of two. Divided signal 234 has 101 cycles between pulses 500 as compared to VCO output signal 222. To achieve multiplication by a factor of two, frequency multiplier 232 inserts additional digital pulses 502 in between digital pulses 500. The output of frequency multiplier 232—i.e., divided frequency signal 206—is applied to phase frequency detector 202 as discussed above.

FIG. 6 shows an implementation of high resolution frequency divider 208 (FIG. 2). High resolution frequency divider 208 is operable to generate a digital signal having one or more digital pulses based on an integer divisor N, and insert additional digital pulses between the one or more digital pulses of the digital signal according to a multiplication factor. If the multiplication factor does not divide evenly into the integer divisor N, then one or more of the inserted additional digital pulses are re-sampled accordingly, as discussed in greater detail below.

High resolution frequency divider 208 includes a counter 600 and a re-sampling circuit 602. Counter 600 can be a high frequency N bit [0, 1 . . . , (N−1)] counter that is clocked by VCO output signal 222. Counter 600 outputs a digital pulse at every Nth cycle (or (N−1) bit) to create divided signal 234. Counter 600 can also output additional signals (not shown) having digital pulses at every Nth cycle for other bit locations within counter 600 based on a multiplication factor. For example, if integer divider 230 divides by an integer divisor of 100 and frequency multiplier 232 is a (2×) multiplier, the multiplication factor (2) divides into the integer divisor (100) fifty times. Counter 600 can, therefore, output a digital signal having a digital pulse for bit location 99 (every Nth cycle) and a second digital signal having a digital pulse for bit location 49 (every Nth cycle). Divided signal 234, and any additional signals, are provided to a flip flop 604 within re-sampling circuit 602.

If the multiplication factor does not divide evenly into the integer divisor N (e.g., as determined by a PLL designer), then re-sampling circuit 602 is operable to re-sample one or more of the additional digital pulses using one or more of the phase signals generated by, for example, multiphase VCO 220 (i.e., ring oscillator 300).

Re-sampling circuit 602 includes a multiplexer 606 that receives the phase signals (e.g., ph0-ph7) generated by, for example, multiphase VCO 220. Multiplexer 606 is controlled through a control signal 608 to selectively output one of the phase signals (e.g., ph0-ph7) to clock flip-flop 604, and flip flop 604 accordingly produces divided frequency signal 206. Using the phase signals (e.g., ph0-ph7), flip-flop 604 can be clocked such that divided signal 234 is multiplied by a factor of up to 8×. Unlike a conventional PLL, PLL 200 does not require a fractional divider or use of a second PLL as a frequency multiplier to achieve high frequency resolution.

FIG. 7 shows an alternative implementation of high resolution frequency divider 208 shown in FIG. 2. In this implementation, high resolution frequency divider 208 implements a 2× multiplier. High resolution frequency divider 208 includes a counter 700 and a re-sampling circuit 702. Counter 700 can be a high frequency N bit [0, 1 . . . , (N−1)] counter that is clocked by VCO output signal 222. Counter 700 outputs a digital pulse at every Nth cycle (or (N−1) bit) to create divided signal 234. Divided signal 234 is provided to an OR gate 704 within re-sampling circuit 702.

Counter 700 also outputs a digital pulse 706 at every (N−1)/2 bit to a flip-flop 708 and a multiplexer 710. Flip-flop 708 can be clocked, for example, by phase signal ph4 (that is generated by ring oscillator 300) to re-sample digital pulse 706 according to phase signal ph4. Depending upon whether the last bit (or least significant bit) of the binary value of the integer divisor N is a 0 or a 1—i.e., whether the integer divisor N is even or odd, based on PLL requirements—multiplexer 710 is controlled to selectively output digital pulse 706 or a re-sampled digital pulse 706. The output of multiplexer 710 can be represented by, for example, digital pulse 502 (FIG. 5). Digital pulse 502 is provided to OR gate 704 (along with divided signal 234). The output of OR gate 704 represents divided frequency signal 206. Re-sampling circuit 702 can be extended to provide a 4× or an 8× multiplier by further cascading multiple re-sampling circuits substantially similar to re-sampling circuit 702. As such, a very high frequency resolution for the PLL can be obtained.

FIG. 8 shows a process 800 for adjusting an output signal. An output signal having a controllable frequency is generated (e.g., by a VCO) (step 802). One or more phase signals are generated, each delayed with respect to the output signal (step 804). In one implementation, as discussed above, the phase signals are generated by a multiphase VCO. A digital signal having one or more digital pulses is generated based on an integer divisor N (step 806). Additional digital pulses are inserted between the one or more digital pulses of the digital signal according to a multiplication factor (step 808).

A determination is made whether the multiplication factor divides evenly into the integer divisor N (step 810). In one implementation, modular (or modulo) arithmetic is used to determine whether the multiplication factor divides evenly into the integer divisor N. If the multiplication factor does not divide evenly into the integer divisor N, then one or more of the additional digital pulses are re-sampled based on one or more of the phase signals (step 812). The digital signal is compared to a reference signal, and an error signal is generated based on a difference between the divided output signal and the reference signal (step 814). The output signal (e.g., generated by a VCO) is adjusted based on the error signal (step 816).

FIG. 9 shows a PLL 900 for generating a signal having a controlled frequency. PLL 900 operates substantially the same as PLL 200 (FIG. 2), however, PLL 900 includes a feedback loop 902 that further includes high resolution frequency divider 904. High resolution frequency divider 904 includes a phase selector 906 and an integer divider 908. In one implementation, phase selector 906 receives a plurality of phase signals from multiphase VCO 220, and is operable to output a selected phase signal 910 to integer divider 908. Integer divider 908 divides phase signal 910 by an even or odd integer divisor to produce a divided frequency signal 912.

FIG. 10 shows an example timing diagram for VCO output signal 222, phase signal 910, and divided frequency signal 912. For the example of FIG. 10, VCO 220 is a differential, 4-stage ring oscillator that outputs a plurality of phase signals as shown in FIG. 4, and integer divider 908 divides by an integer divisor of 50. In one implementation, phase selector 906 initially outputs phase signal 910 having a phase in accordance with ph0, and after a number of cycles, phase selector 906 is controlled to output phase signal 910 having a phase in accordance with ph1. In one implementation, the number of cycles after which phase selector 906 is controlled to output phase signal 906 having a different phase is less than a number associated with the integer divisor of integer divider 908 (e.g., 50 cycles).

Integer divider 908 receives and divides phase signal 910 by an integer divisor (e.g., 50) to produce divided frequency signal 912. Divided frequency signal 912, has 50⅛th cycles between pulses 1000 as compared to VCO output signal 222. Divided frequency signal 912 is applied to phase frequency detector 202 as discussed above. The frequency resolution for the PLL can, therefore, be substantially equal to a phase difference between adjacent stages of a VCO ring oscillator.

FIG. 11 shows a process 1100 for adjusting an output signal. An output signal having a controllable frequency is generated (e.g., by a VCO) (step 1102). One or more phase signals are generated, each delayed with respect to the output signal (step 1104). In one implementation, as discussed above, the phase signals are generated by a multiphase VCO. A first phase signal having a first phase is output to an integer divider (step 1106). After a pre-determined number of cycles, a second phase signal having a second phase is output to the integer divider (step 1108). The first phase signal and the second phase signal can be selected from the one or more phase signals generated, for example, by a VCO. In one implementation, the pre-determined number of cycles is less than a number associated with an integer divisor of integer divider. In one implementation, only two phase signals having differing phases are output to an integer divider (each at a different time) to produce a divided output signal. More generally, any number of phase signals can be provided to an integer divider. The phase signal received by the integer divider is divided according to an integer divider to produce a divided output signal (step 1110).

Referring again to FIG. 9, PLL 900 can further include an interpolator 914 to interpolate output signal 226 and produce an interpolated output signal 916 having a desired resolution. Unlike a conventional interpolator that typically requires use of a second PLL to generate an additional phase signal shifted from output signal 226, interpolator 914 selects an appropriate phase signal that is shifted from output signal 226 among phase signals output from multiphase VCO 220.

FIG. 12 shows an example timing diagram for phase signals ph0 and ph2 of multiphase VCO 220. For the example of FIG. 12, VCO 220 is a differential, 4-stage ring oscillator that outputs a plurality of phase signals as shown in FIG. 4, programmable divider 224 divides by a factor of 2, and interpolator 914 is a 45° phase interpolator. As shown in FIG. 12, phase signals ph0 and ph2 initially have a phase difference of 90°. However, after passing through programmable divider 224 (which divides by a factor of 2), phase signals ph0 and ph2 have a phase difference of 45° and can, therefore, be used by interpolator 914 to produce interpolated output signal 916.

PLLs 200, 900 can be employed in a wide range of applications, for example, in a read/write head 1302 of a disk drive system 1300, as shown in FIG. 13. Disk drive system 1300 can also include a preamplifier 1304, a read channel 1306, and a variety of disk control circuitry (not shown) to control the operation of a hard disk drive.

In a read operation, an appropriate sector of a disk (not shown) is located and data that has been previously written to the disk is detected. Read/write head 1302 senses changes in magnetic flux according to a control signal supplied by PLL 200 (or PLL 900) and generates a corresponding analog read signal. Preamplifier 1304 receives and amplifies the analog read signal. The amplified analog read signal is provided to read channel 1306. Read channel 1306 conditions the amplified analog read signal and, in one implementation, detects "zeros" and "ones" from the signal to generate a digital read signal. Read channel 1306 may condition the digital read signal by further amplifying the digital read signal to an appropriate level using, for example, automatic gain control (AGC) techniques. Read channel 1306 may then filter the amplified digital read signal to eliminate unwanted high frequency noise, perform data recovery, and format the digital read signal. The digital read signal can be transferred from read channel 1306 and stored in memory (not shown).

A number of implementations have been described. Nevertheless, it will be understood that various modifications may be made. For example, multiphase VCO 220 (FIG. 2) can be implemented as an N-stage ring oscillator, where N is an integer greater than or equal to 1. In addition, multiphase VCO 220 can be a differential ring oscillator, as described above, or single ended, or formed by an inductor-capacitor (LC) tank circuit. Furthermore, fixed frequency reference signal 204 (FIG. 2) can be implemented as a reference signal that varies. Programmable divider 224 can divide by an integer greater than or equal to 1. Interpolator 914 can interpolate phase signals having a phase difference other than 45°. Accordingly, other implementations are within the scope of the following claims.

What is claimed is:

1. A phase locked loop, comprising:
   a feedback loop, the feedback loop including,
   a phase selector operable to initially provide a first feedback loop signal having a first phase to an integer divider for a pre-determined number of at least two cycles, the phase selector further operable to provide a second feedback loop signal having a second different phase to the integer divider for at least two cycles immediately after the pre-determined number of cycles; and
   the integer divider operable to divide each of the first feedback loop signal and the second feedback loop signal in accordance with an integer divisor to produce a divided signal, the first feedback loop signal being divided during the pre-determined number of cycles, the second feedback loop signal being divided after the pre-determined number of cycles.

2. The phase locked loop of claim 1, further comprising a multiphase voltage controlled oscillator operable to generate the first feedback loop signal and the second feedback loop signal.

3. The phase locked loop of claim 2, further comprising a phase-frequency detector operable to compare a reference signal to the divided signal, and generate an error signal corresponding to a frequency difference between the reference signal and the divided signal.

4. The phase locked loop of claim 3, further comprising a charge pump operable to convert the error signal into a charge pump output signal.

5. The phase locked loop of claim 4, further comprising a loop filter operable to smooth the charge pump output signal and generate a voltage controlled oscillator control signal to control a frequency of an output signal of the multiphase voltage controlled oscillator.

6. The phase locked loop of claim 5, further comprising a programmable divider operable to divide the frequency of the output signal of the multiphase voltage controlled oscillator.

7. The phase locked loop of claim 6, further comprising an interpolator to interpolate an output of the programmable divider with a signal having a different phase relative to a phase of the output of the programmable divider.

8. The phase locked loop of claim 7, wherein the signal having the different phase is derived from the multiphase voltage controlled oscillator.

9. A method comprising:
providing a first signal having a first phase to an integer divider for a pre-determined number of at least two cycles;
providing a second signal having a second different phase to the integer divider for at least two cycles immediately after the pre-determined number of cycles; and
dividing each of the first signal and the second signal in accordance with an integer divisor using the integer divider to generate a divided signal, the first signal being divided during the pre-determined number of cycles, the second signal being divided after the pre-determined number of cycles.

10. The method of claim 9, further comprising generating the first signal and the second signal using a multiphase voltage controlled oscillator.

11. The method of claim 10, further comprising comparing a reference signal to the divided signal, and generating an error signal corresponding to a frequency difference between the reference signal and the divided signal.

12. The method of claim 11, further comprising converting the error signal into a charge pump output signal.

13. The method of claim 12, further comprising smoothing the charge pump output signal and generating a voltage controlled oscillator control signal to control a frequency of an output signal of the multiphase voltage controlled oscillator.

14. The method of claim 13, further comprising dividing the frequency of the output signal of the multiphase voltage controlled oscillator using a programmable divider.

15. The method of claim 14, further comprising interpolating an output of the programmable divider using a signal having a different phase relative to a phase of the output of the programmable divider.

16. The method of claim 15, further comprising deriving the signal having the different phase using the multiphase voltage controlled oscillator.

17. A disk drive system, comprising:
a read/write head configured to sense changes in magnetic flux on a surface of a disk according to a control signal supplied by a phase locked loop (PLL) and generate a corresponding analog signal, the PLL including,
a phase selector operable to initially provide a first feedback loop signal having a first phase to an integer divider for a pre-determined number of at least two cycles,
the phase selector further operable to provide a second feedback loop signal having a second different phase to the integer divider for at least two cycles immediately after the pre-determined number of cycles; and
the integer divider operable to divide each of the first feedback loop signal and the second feedback loop signal in accordance with an integer divisor to produce a divided signal, the first feedback loop signal being divided during the pre-determined number of cycles, the second feedback loop signal being divided after the pre-determined number of cycles;
the disk drive system further comprising a preamplifier configured to amplify the analog signal; and
a read channel configured to receive the amplified analog signal and generate a digital read signal based on the amplified analog signal.

18. The disk drive system of claim 17, wherein the PLL further includes a multiphase voltage controlled oscillator operable to generate the first feedback loop signal and the second feedback loop signal.

19. The disk drive system of claim 18, wherein the PLL further includes a phase-frequency detector operable to compare a reference signal to the divided signal, and generate an error signal corresponding to a frequency difference between the reference signal and the divided signal.

20. The disk drive system of claim 19, wherein the PLL further includes a charge pump operable to convert the error signal into a charge pump output signal.

21. The disk drive system of claim 20, wherein the PLL further includes a loop filter operable to smooth the charge pump output signal and generate a voltage controlled oscillator control signal to control a frequency of an output signal of the multiphase voltage controlled oscillator.

22. The disk drive system of claim 21, wherein the PLL further includes a programmable divider operable to divide the frequency of the output signal of the multiphase voltage controlled oscillator.

23. The disk drive system of claim 22, wherein the PLL further includes an interpolator to interpolate an output of the programmable divider with a signal having a different phase relative to a phase of the output of the programmable divider.

24. The disk drive system of claim 23, wherein the signal having the different phase is derived from the multiphase voltage controlled oscillator.

25. A phase locked loop, comprising:
feedback means including,
selector means for initially providing a first feedback loop signal having a first phase to a dividing means for a pre-determined number of at least two cycles, the selector means further operable to provide a second feedback loop signal having a second different phase to the dividing means for at least two cycles immediately after the pre-determined number of cycles; and
the dividing means for dividing each of the first feedback loop signal and the second feedback loop signal in accordance with an integer divisor to produce a divided signal, the first feedback loop signal being divided during the pre-determined number of cycles, the second feedback loop signal being divided after the pre-determined number of cycles.

26. The phase locked loop of claim 25, further comprising generating means for generating the first feedback loop signal and the second feedback loop signal.

27. The phase locked loop of claim 26, further comprising means for comparing a reference signal to the divided signal, and generating an error signal corresponding to a frequency difference between the reference signal and the divided signal.

28. The phase locked loop of claim 27, further comprising means for converting the error signal into a charge pump output signal.

29. The phase locked loop of claim 28, further comprising means for smoothing the charge pump output signal and generating a control signal to control a frequency of an output signal of the generating means.

30. The phase locked loop of claim 29, further comprising programmable means for dividing the frequency of the output signal of the generating means.

31. The phase locked loop of claim 30, further comprising means for interpolating an output of the programmable means with a signal having a different phase relative to a phase of the output of the programmable means.

32. The phase locked loop of claim 31, wherein the signal having the different phase is derived from the generating means.

33. A disk drive system, comprising:

sensing means for sensing changes in magnetic flux on a surface of a disk according to a control signal supplied by a phase locking means and generating a corresponding analog signal, the phase locking means including, selector means for initially providing a first feedback loop signal having a first phase to a dividing means for a pre-determined number of at least two cycles, the selector means further operable to provide a second feedback loop signal having a second different phase to the dividing means for at least two cycles immediately after the pre-determined number of cycles; and the dividing means for dividing each of the first feedback loop signal and the second feedback loop signal in accordance with an integer divisor to produce a divided signal, the first feedback loop signal being divided during the pre-determined number of cycles, the second feedback loop signal being divided after the pre-determined number of cycles;

the disk drive system further comprising means for amplifying the analog signal; and means for receiving the amplified analog signal and generating a digital read signal based on the amplified analog signal.

34. The disk drive system of claim 33, wherein the phase locking means further includes generating means for generating the first feedback loop signal and the second feedback loop signal.

35. The disk drive system of claim 34, wherein the phase locking means further includes means for comparing a reference signal to the divided signal, and generating an error signal corresponding to a frequency difference between the reference signal and the divided signal.

36. The disk drive system of claim 35, wherein the phase locking means further includes means for converting the error signal into a charge pump output signal.

37. The disk drive system of claim 36, wherein the phase locking means further includes means for smoothing the charge pump output signal and generating a control signal to control a frequency of an output signal of the generating means.

38. The disk drive system of claim 37, wherein the phase locking means further includes programmable means for dividing the frequency of the output signal of the generating means.

39. The disk drive system of claim 38, wherein the phase locking means further includes means for interpolating an output of the programmable means with a signal having a different phase relative to a phase of the output of the programmable means.

40. The disk drive system of claim 39, wherein the signal having the different phase is derived from the generating means.

* * * * *